United States Patent [19]

Kopp

[11] Patent Number: 5,497,376
[45] Date of Patent: Mar. 5, 1996

[54] METHOD AND DEVICE FOR DETECTING AND CORRECTING ERRORS IN MEMORY MODULES

[75] Inventor: Dieter Kopp, Hemmingen, Germany

[73] Assignee: Alcatel NV, Netherlands

[21] Appl. No.: 301,231

[22] Filed: Aug. 26, 1994

[30] Foreign Application Priority Data

Aug. 28, 1993 [DE] Germany .................. 43 29 012.4

[51] Int. Cl.⁶ ..................... G11C 29/00; G06F 11/10
[52] U.S. Cl. ........................................................... 371/10.2
[58] Field of Search ................... 371/37.3, 40.4, 371/40.1, 40.2, 10.1, 10.2, 10.3; 365/200, 201; 364/245.3, 268.5, 970.1

[56] References Cited

U.S. PATENT DOCUMENTS

| | | | |
|---|---|---|---|
| 4,493,075 | 1/1985 | Anderson et al. | 371/10.3 |
| 4,584,681 | 4/1986 | Singh et al. | 371/10.1 |
| 4,608,687 | 8/1986 | Dutton | 371/10.2 |
| 4,627,093 | 12/1986 | Hashimoto et al. | 381/51 |
| 4,654,847 | 3/1987 | Dutton | 371/10.1 |
| 4,939,694 | 7/1990 | Eaton et al. | 365/200 |
| 5,199,033 | 3/1993 | McGeoch et al. | 371/10.1 |
| 5,200,959 | 4/1993 | Gross et al. | 371/21.6 |
| 5,263,032 | 11/1993 | Porter et al. | 371/40.2 |
| 5,267,242 | 11/1993 | Lavallee et al. | 371/10.1 |
| 5,278,839 | 1/1994 | Matsumoto et al. | 371/10.2 |
| 5,357,473 | 10/1994 | Mizuno et al. | 365/201 |
| 5,359,569 | 10/1994 | Fujita et al. | 365/229 |
| 5,359,570 | 10/1994 | Hsu et al. | 365/230.01 |

FOREIGN PATENT DOCUMENTS

| | | |
|---|---|---|
| 0052216 | 5/1982 | European Pat. Off. . |
| 4035861 | 5/1982 | Germany . |
| 4204929 | 8/1993 | Germany . |

OTHER PUBLICATIONS

"Built-in Testable Error Detection and Correction", M. Katoozi et al, *IEEE Journal of Solid State Circuits*, vol. 27, No. 1, Jan. 1992, pp. 59–66.
"Mikrocomputer in der Sicherheitstechnik", H. Holscher et al, *Verlag TUV Rheinland*, 1984, pp. 51–52.
"A Reconfigurable Wafer-Scale Memory", A. Boubekeur et al, *IEEE Journal of Solid-State Circuits*, vol. 26, No. 10, Oct. 1991, pp. 1423–1432.
"Mechanism to Test Main Storage and Assign the Hardware System Area and the Operating System Nucleus to Failure Free Storage", A. Sutton et al, *IBM Technical Disclosure Bulletin*, vol. 22, No. 12, May 1980, p. 5415.

*Primary Examiner*—Stephen M. Baker
*Attorney, Agent, or Firm*—Ware, Fressola, Van Der Sluys & Adolphson

[57] ABSTRACT

Single error correction in digital memory modules is simply accomplished at any time by dividing the memory module into segments, writing data into the memory module, testing the memory module after a period of time and, on the occurrence of a single error, data correction is entered. This process is repeated until no single error is found. Such single error correction is fast a single error correction is possible without the need for external memory.

9 Claims, 3 Drawing Sheets

METHOD AND DEVICE FOR DETECTING AND CORRECTING ERRORS IN MEMORY MODULES

TECHNICAL FILED

The invention concerns a method and a device for correcting single errors in memory modules, particularly for use in digital voice storage.

BACKGROUND OF THE INVENTION

So-called ARAM's (Audio Random Access Memories) are preferred as memory modules for digital voice storage. These are so-called DRAM's (Dynamic Random Access Memories) typically have a maximum number of memory errors up to 0.2%(e.g., a maximum of 0.2% errors in memory), as promised by the manufacturer (Texas Instruments, Inc.; 4 Mega Bit ARAM TMA 44 400). In addition, these memory modules have an area that is guaranteed free of errors.

Methods that were known until now for determining the remaining errors operate in accordance with the following principle. After a system containing the memory module is switched on, the memory module is tested for errors by a testing program. The addresses of faulty areas are determined. These addresses are then stored in a different memory. This other memory is e.g. a so-called SRAM module (Static Random Access Memory). The implementation of this method takes about 30 seconds. When the data are written into the memory module, and before the final entry of the data, a test is performed of whether the area into which it will be written is listed as faulty in the SRAM. If the area is listed as faulty, either the next area is used, or a correction value is recorded in the SRAM.

A similar method is used when data is read out from the memory module. However, this method only detects errors while the system is being switched on. It is not possible to correct errors that were not detected during the switching on.

Another possibility is described in the German Patent Application P 42 04 929.6. It describes a digital voice storage system with a memory control, which is able to detect remaining errors and to delete the detected errors with their corresponding addresses in a total register. However, this method is not able to correct the detected errors, but only a faulty storage.

A memory that is free of errors, i.e. avoiding the use of faulty memory areas, is of great significance for the storage of voice messages. The use of faulty memory areas, which together could exceed a predetermined error rate, would lead to impairments during reproduction, which could result in undesirable audible interference, or even failures.

DISCLOSURE OF INVENTION

The invention has the task of developing a method and a device which can perform an error test and an error correction.

According to the present invention, errors in memory modules are detected and corrected by dividing the memory modules into segments, wherein before data is written in, any accumulation of errors is detected by means of a memory test, wherein on the occurrence of an accumulation of errors, the segment is no longer used for storing data, wherein after expiration of a period of time following the write-in of data, each segment is checked for single errors, wherein on the occurrence of a single error, correction data is written into the segment, and wherein said check for single errors is repeated until no error is detected.

In further accord with the present invention, an apparatus for detecting and correcting errors in memory modules divided into segments comprises write and read means for writing and reading data into and from the segments of memory modules, first means for carrying out a memory test to detect an accumulation of errors, second means for carrying out a memory test to detect single errors, and write means for writing correction data into the memory modules.

It is an advantage that limited memory space can be optimally used at relatively low cost. Particularly, voice storage requires extensive memory space, for which reason the existing memory space must be used to an optimum degree.

Another important advantage is that the existing errors are not only sought at the start-up time, but errors that exist during data input can also be detected. This increases the error detection rate and thereby the security against undesirable interference.

According further to the present invention, on the occurrence of a single error, an error counter is incremented by one, and if the count of the error counter exceeds a predetermined value, the segment will no longer be used for storing data. An error counter is thus provided for counting single errors. When any predetermined number of single errors is exceeded, e.g., when the error count exceeds a predetermined value, the segment is determined to be faulty and is no longer used for storing data, which further increases the security against undesired interference or even failures.

According still further to the present invention, each segment is divided into a plurality of words, wherein as the first two words of each segment, the number of single errors is entered, wherein from the third word, the data is written in, and wherein from the last word of each segment, the correction data is written in, in the direction of the first word.

In still further accord with the present invention, to perform the correction, the data of each segment is read as a whole, and wherein from the, single error count contained in both of the first two words the area containing the data and the area containing the correction data are calculated.

The foregoing thus describes a possibility for reading out the data. By knowing the number of single errors, it is possible to calculate and detect the area into which the data were written.

According further to the present invention, the apparatus for detecting and correcting single errors in memory modules divided into segments further comprises means for calculating areas into which data have to be entered and areas into which correction data have to be entered, and an error counter for counting the number of single errors.

According further to the method of the present invention, such may be used for recording spoken messages in digital answering machines, or in telecommunication terminals for video, text, and voice communication.

Thus, the present invention can be advantageously applied for voice storage in digital telephone answering devices or in telecommunication terminals. A special application is found for picture, text or voice communication.

These and other objects, features and advantages of the present invention will become more apparent in light of the detailed description of a best mode embodiment thereof, as illustrated in the accompanying drawings.

BEST MODE FOR CARRYING OUT THE INVENTION

The following explains a method according to the present invention. In a method for correcting errors in memory modules, such as e.g. in semiconductor components designated as ARAM (Audio Random Access Memories), the memory module is divided into segments. As will be explained later by means of FIG. 3, the segments consist of a predetermined number of words, also called bytes.

Figure 1:
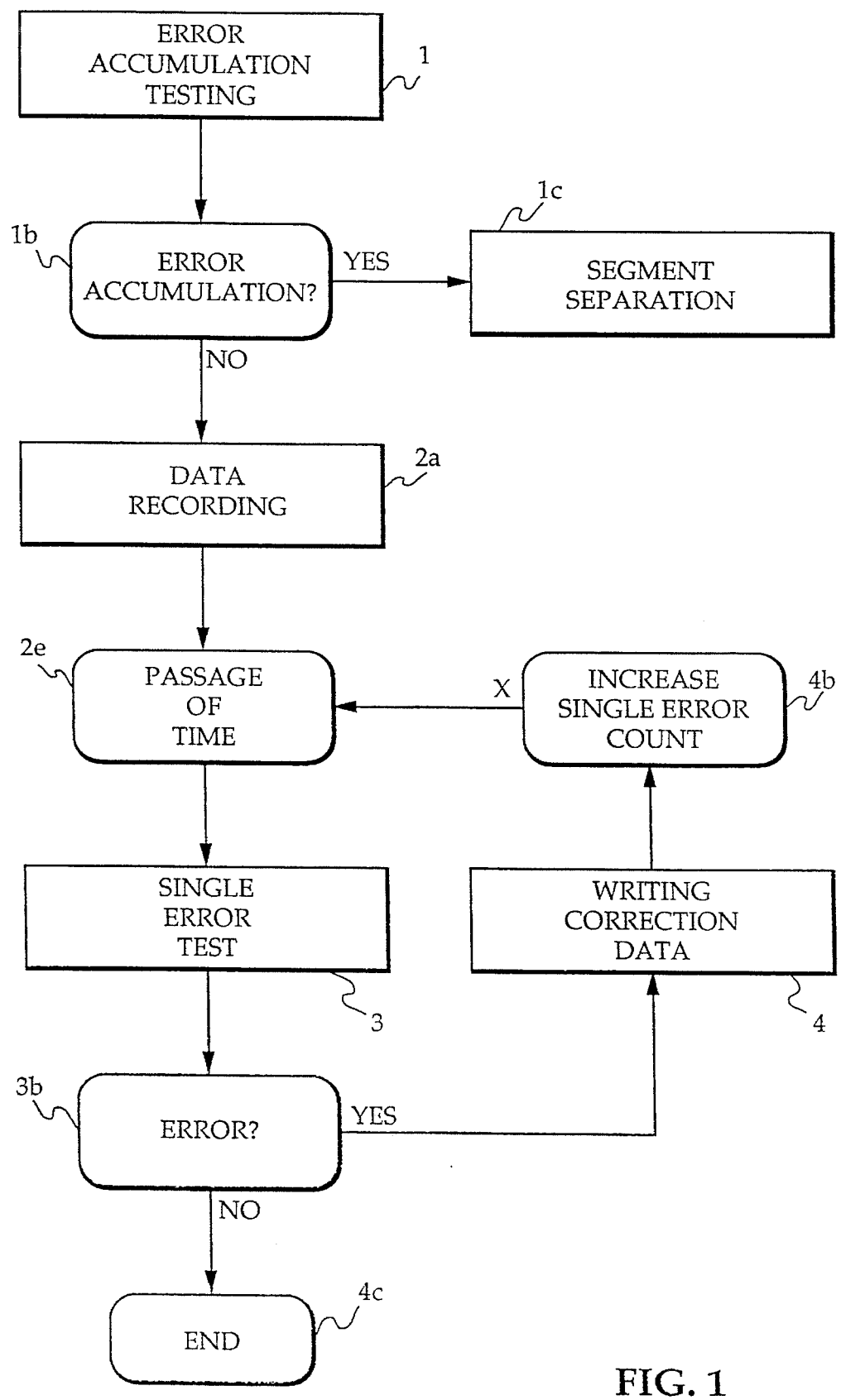
FIG. 1 shows a flow diagram of a method, according to the present invention.
Figure 2:
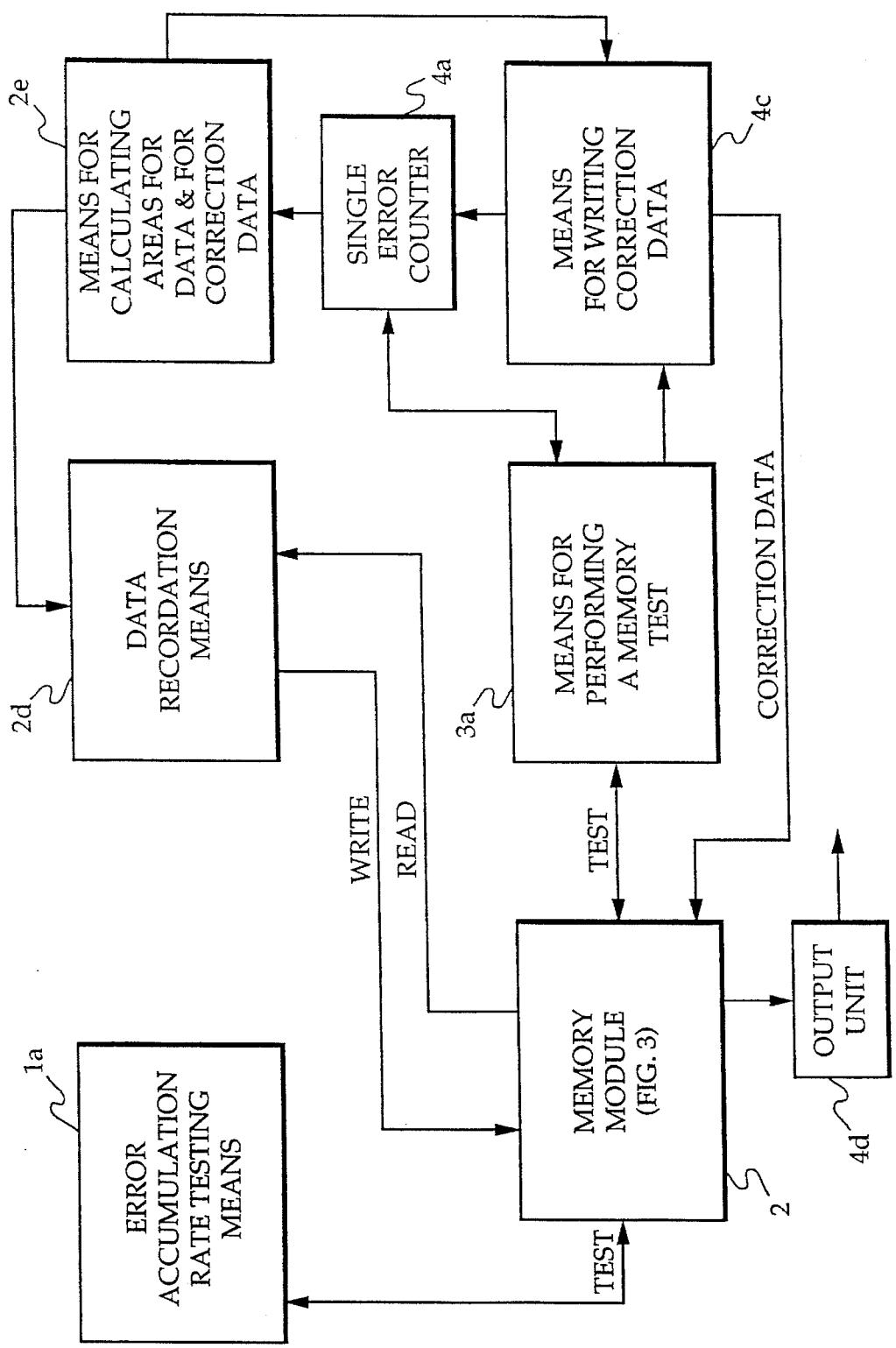
FIG. 2 shows an apparatus, according to the present invention.

A test of the error accumulation rate in each of the segments of a memory module 2 of FIG. 2 is performed, as shown in a step 1 of FIG. 1 before data can be written into the memory module. This simple test is performed with a first means 1a, as shown in FIG. 2 for carrying out a memory test to detect an error accumulation, and in the event an error accumulation is detected for any of the segments as determined in a step 1b, the respective segment is not used for storing data and is separated, as indicated in a step 1c.

For the segments in which no error accumulation has occurred, the method according to FIG. 1 continues and data are written into the memory module 2 of FIG. 2, as shown in a step 2a of FIG. 1. This takes place with data recording means 2d of FIG. 2, i.e., reading and writing means. The data recording means 2d records data in the memory module 2 under control of means for calculating areas for data and for correction data 2e, which will be described in greater detail hereinafter.

After the data entry is completed, and after waiting for a predetermined period of time, as indicated by a step 2e of FIG. 1, a single error test is performed, as indicated in a step 3. This takes place through second means 3a for performing a memory test to detect single errors, as indicated by a step 3b, which also tests whether the data have been recorded.

The segment data are tested to detect single errors. The data are read and the method, which will be explained in more detail later, determines exactly where correction data and where data, e.g. voice data, are located.

In the event a single error is detected in a segment, correction data are recorded in the faulty segment of the memory module, as indicated by a step 4 of FIG. 1. Means for writing correction data 4c of FIG. 2 is provided for recording correction data in the segment. The means for writing correction data 4c is responsive to a signal provided by the means for performing a memory test 3a indicative of a single error for writing the correction data in the respective segment. The means for writing correction data 4c records the correction data in the segment of the memory module 2 under control of the means for calculating areas for data and for correction data 2e. A single error counter 4a of FIG. 2 associated with each segment increases by one for each occurring and detected single error, as indicated in a step 4b of FIG. 1. Thus, the error counter 4a indicates the absolute number of single errors in a memory segment.

After that the above explained process is repeated by again waiting for a period of time, as indicated by the step 2e, for the next single error test.

This cycle is repeated until no further single error is detected, as determined in the step 3b. The process for correcting single errors ends in a step 4c if no further single error occurs.

In addition to the earlier described function of recording data in the memory modules, the above described reading and writing means 2d are also able to read data from the memory module and route them for example to an output unit 4d.

Figure 3:
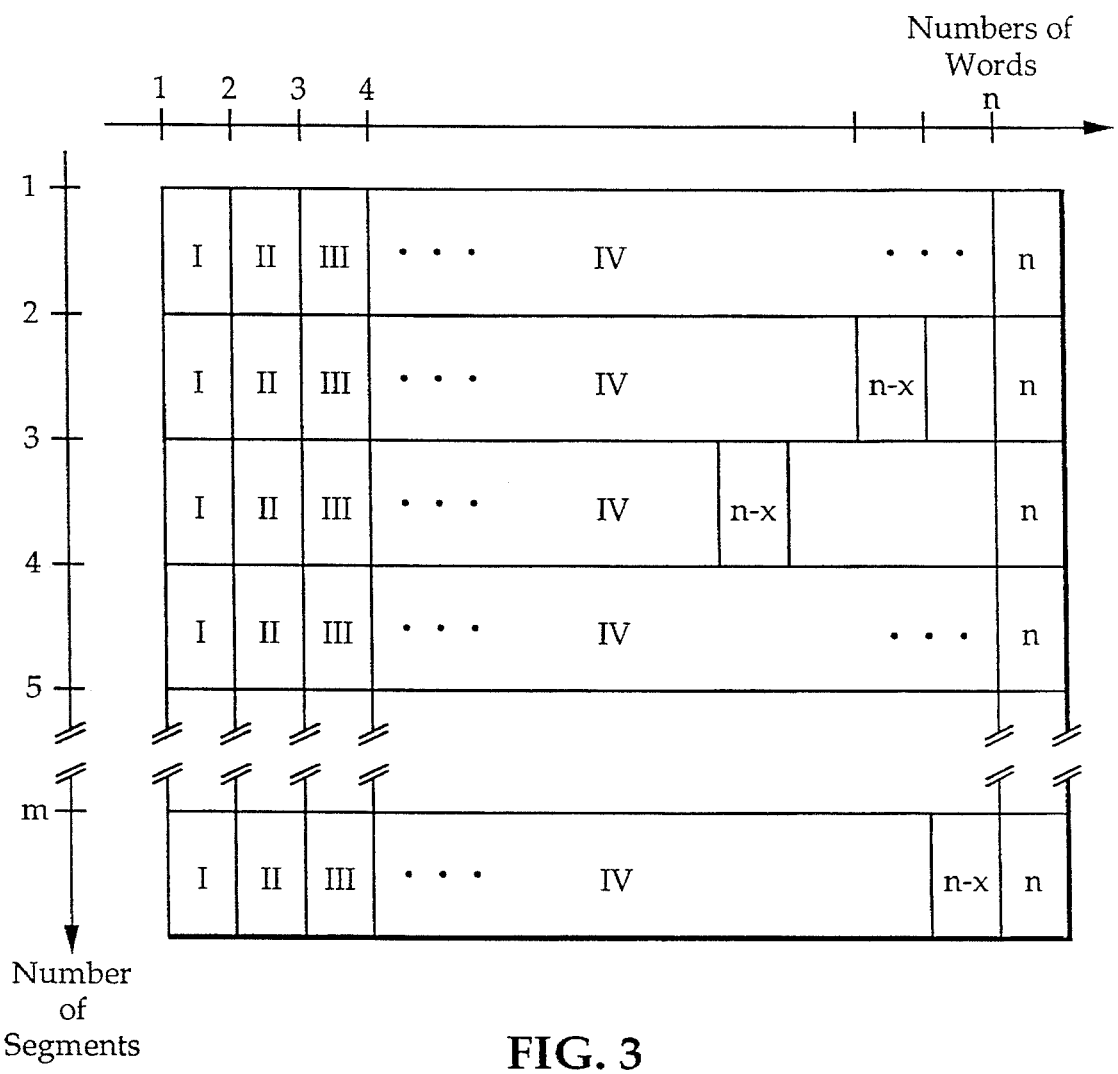
FIG. 3 is a schematic representation of a memory module, according to the present invention.

The division of the memory module 2 is explained in the following by means of FIG. 3 and FIG. 4.

The memory module 2, for example an ARAM, is divided into segments. The number m of segments is variable. Each segment in turn is subdivided into a predetermined number n of words. The number m of segments depends on the number n of words and the total size of the memory module. The division of segments into 512 bytes per segment is an advantage if the total size of the memory module is 4 Mbit, e.g., m=1,024, n=512 and a word is 8 bits.

Figure 4:
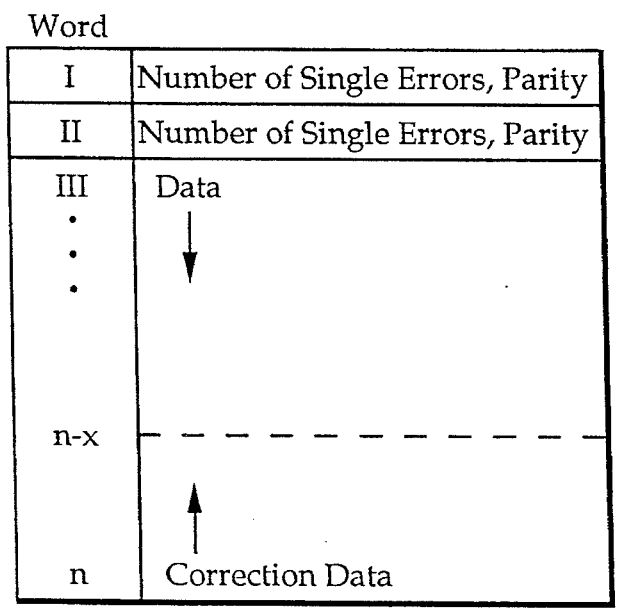
FIG. 4 is a representation of a segment, according to the present invention.

A segment is composed of n words, where the utilization of each individual word can be seen in FIG. 4. The first word I picks up the number x single of errors. The same applies to the second word II of each segment.

Data can be recorded in the segment starting with the third word. This corresponds to areas III and IV.

The correction data are sucessively recorded in the segment in the direction of the segment start, beginning with the last word n.

This results in a variable number of words in a segment, the variable number having a value of n–x between the beginning of the segment and the first of the correction data contained in the segment where x corresponds to a whole number that is greater or equal to zero and equal to the number of single errors in the segment.

The value of n–x, i.e., the number of words in a segment that do not contain correction data, varies for each segment 1 to m, depending on the number x of single errors in each of the segments 1 to m.

The number of single errors recorded in the first and in the second word I and II is protected by parity.

The advantageous use of this segment structure, the resulting memory module division and the use of the method for correcting single errors is shown in the following:

When data is read, the whole segment is read. The single error count x contained in both of the first two words is used to calculate in which area data and in which area correction data are located.

For example, if a correction is performed, the number of single errors and the calculation determine precisely where the correction data must be recorded, since they are written from word n in the direction of word 1, as described earlier.

This knowledge is used to perform a data correction during the reading. The above described method steps and the device can be used to advantage for storing digital voice data, for example in a telephone answering device.

When digital voice data is stored in a telephone answering device, reference data representing a kind of table of contents, are stored. The reference data provide the date and the time when a message was stored, and thereby also a record of the message. It must further be possible to determine from what point on a new message was stored in the memory. These reference data can either be stored like the voice data, or they are stored in a guaranteed error-free area. This guaranteed error-free area is guaranteed by the manufacturer of the semiconductor components. All these data are also recorded with parity and these data are also tested for errors after a period of time has passed.

The correction data are recorded in the guaranteed error-free area along with the address of the single error corresponding to the correction data.

The method explained above and the device are applied to advantage not only for storing voice data, but also for storing picture and text data, where a previously mentioned memory module, such as for example an ARAM or even a DRAM, is used.

Although the invention is described in FIG. 2 as having a data recordation means 2d and a means for writing correction data 4c, it is possible that the data recordation means can be used to write both data and correction data into segments of the memory module 2.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

I claim:

1. A method of detecting and correcting errors in memory modules wherein each memory module is divided into segments, wherein before data is written in to a memory module, any accumulation of errors in a segment of the memory module is detected by means of a memory test, wherein on the occurrence of an accumulation of errors, the segment is no longer used for storing data, wherein data is written in to the memory module, excluding those segments which are no longer used for storing data, wherein after expiration of a period of time following the write-in of data, each segment is checked for single errors, wherein on the occurrence of a single error, correction data is written into the segment, and wherein said check for single errors is repeated until no single error is detected.

2. A method as claimed in claim 1, wherein on the occurrence of a single error in a segment, an error counter is incremented by one, the error counter indicating the absolute number of single errors in a corresponding segment, and wherein if the count of the error counter exceeds a predetermined value, the corresponding segment will no longer be used for storing data.

3. A method as claimed in claim 1, wherein said memory module is used in digital answering machines for recording spoken messages.

4. A method as claimed in claim 1, wherein said memory module is used in telecommunication terminals for video, text, and voice communications.

5. A method as claimed in claim 1, wherein each segment is divided into a plurality of words, wherein as the first two words of each segment, a count of the number of single errors is entered, wherein from the third word, the data is written in, and wherein from the last word of each segment, the correction data is written in the direction of the first word.

6. A method as claimed in claim 5, wherein to perform the correction, the data of each segment is read as a whole, and wherein from said single error count, the area containing the data and the area containing the correction data are calculated.

7. Apparatus for detecting and correcting errors in memory modules divided into segments, said apparatus comprising:

write and read means for writing and reading data into and from the segments of memory modules, first means for carrying out a memory test to detect an accumulation of errors in a segment, second means for carrying out a memory test to detect single errors in a segment, write means responsive to the detection of a single error in one of the segments for writing correction data into the one segment, means for calculating areas into which data have to be entered and areas into which correction data have to be entered, and an error counter for counting the number of single errors.

8. Apparatus as claimed in claim 7, wherein the memory module is responsive to the detection of an accumulation of single errors in a segment for no longer using the segment for storing data.

9. Apparatus as claimed in claim 7, wherein a count in said error counter is indicative of an absolute number of single errors in a corresponding segment, and wherein said memory module is responsive to said count exceeding a predetermined value for no longer using the corresponding segment for storing data.

* * * * *